United States Patent
Lee et al.

(10) Patent No.: US 7,838,422 B2
(45) Date of Patent: Nov. 23, 2010

(54) AL-DOPED CHARGE TRAP LAYER, NON-VOLATILE MEMORY DEVICE AND METHODS OF FABRICATING THE SAME

(75) Inventors: Eun-ha Lee, Seoul (KR); Hion-suck Baik, Cheonan-si (KR); Kwang-soo Seol, Suwon-si (KR); Sang-jin Park, Yongin-si (KR); Jong-bong Park, Suwon-si (KR); Min-ho Yang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 214 days.

(21) Appl. No.: 11/892,849

(22) Filed: Aug. 28, 2007

(65) Prior Publication Data
US 2008/0150010 A1    Jun. 26, 2008

(30) Foreign Application Priority Data
Dec. 21, 2006    (KR) ...................... 10-2006-0132039

(51) Int. Cl.
    *H01L 21/44*    (2006.01)
(52) U.S. Cl. ...................... 438/680; 438/264
(58) Field of Classification Search .................. 438/680, 438/264
    See application file for complete search history.

(56) References Cited

U.S. PATENT DOCUMENTS

| | | | | |
|---|---|---|---|---|
| 6,784,103 B1 * | 8/2004 | Rao et al. | .................... | 438/680 |
| 7,012,297 B2 * | 3/2006 | Bhattacharyya | ............. | 257/317 |
| 7,279,740 B2 * | 10/2007 | Bhattacharyya et al. | ..... | 257/324 |
| 7,442,989 B2 * | 10/2008 | Kobayashi et al. | .......... | 257/325 |
| 2003/0042534 A1 * | 3/2003 | Bhattacharyya | ............. | 257/317 |

FOREIGN PATENT DOCUMENTS

KR    10-2006-0070049    6/2006

* cited by examiner

*Primary Examiner*—Howard Weiss
*Assistant Examiner*—Steven H Rao
(74) *Attorney, Agent, or Firm*—Harness, Dickey & Pierce, P.L.C.

(57) ABSTRACT

Provided is an aluminum (Al) doped charge trap layer, a non-volatile memory device and methods of fabricating the same. The charge trap layer may include a plurality of silicon nano dots that trap charges and a silicon oxide layer that covers the silicon nano dots, wherein the charge trap layer is doped with aluminum (Al). The non-volatile memory device may include a substrate including a source and a drain on separate regions of the substrate, a tunneling film on the substrate contacting the source and the drain, the charge trap layer according to example embodiments, a blocking film on the charge trap layer, and a gate electrode on the blocking film.

11 Claims, 7 Drawing Sheets

AL-DOPED CHARGE TRAP LAYER, NON-VOLATILE MEMORY DEVICE AND METHODS OF FABRICATING THE SAME

PRIORITY STATEMENT

This application claims priority under 35 U.S.C. §119 to Korean Patent Application No. 10-2006-0132039, filed on Dec. 21, 2006, in the Korean Intellectual Property Office (KIPO), the entire contents of which are incorporated herein by reference.

BACKGROUND

1. Field

Example embodiments relate to an aluminum (Al)-doped charge trap layer, a non-volatile memory device having and methods of fabricating the same.

2. Description of the Related Art

A non-volatile memory device that uses conventional silicon nano dots as a charge trap layer may have unstable retention characteristics. Also, in the non-volatile memory device that uses conventional silicon nano dots as the charge trap layer, the conventional silicon nano dots may be formed by annealing a silicon rich oxide film at a relatively high temperature. However, when the silicon rich oxide film is annealed at a relatively high temperature, a tunneling film of the non-volatile memory device may be degraded by the diffusion of silicon.

SUMMARY

Example embodiments provide an aluminum (Al)-doped charge trap layer and a non-volatile memory device having improved retention characteristics. Example embodiments also provide a method of forming the charge trap layer and the method of fabricating a non-volatile memory device that has improved retention characteristics and may prevent or reduce the degradation of a tunneling film of the non-volatile memory device.

According to example embodiments, a charge trap layer may include a plurality of silicon nano dots that trap charges and a silicon oxide layer that covers the silicon nano dots, wherein the charge trap layer is doped with aluminum (Al). The charge trap layer may be doped with aluminum (Al) at a concentration of about 0.1 atom % to about 10 atom %. The charge trap layer may be formed to a thickness of about 2 nm to about 10 nm.

According to example embodiments, a non-volatile memory device may include a substrate including a source and a drain on separate regions of the substrate, a tunneling film on the substrate to contact the source and the drain, the charge trap layer according to example embodiments, a blocking film on the charge trap layer; and a gate electrode on the blocking film. The blocking film may be made of a compound selected from the group consisting of $Si_3N_4$, $HfO_2$, $Ta_2O_5$, $ZrO_2$, and $Al_2O_3$. The blocking film may be formed to a thickness of about 20 nm to about 30 nm. The gate electrode may be made of gold, aluminum, ruthenium, or an alloy thereof. The substrate may be a p-type silicon substrate. The source and drain may be doped with an n-type impurity. The tunneling film may be a silicon oxide film.

According to example embodiments, a method of forming a charge trap layer structure may include forming an amorphous silicon film on a tunneling film, forming a charge trap layer having a plurality of silicon nano dots and a silicon oxide layer covering the silicon nano dots by partially oxidizing the amorphous silicon film, and doping the charge trap layer with aluminum (Al). The charge trap layer may be doped with aluminum (Al) at a concentration of about 0.1 atom % to about 10 atom %. Forming the amorphous silicon film on the tunneling film may include depositing the amorphous silicon film to a thickness of about 1 nm to about 5 nm.

Forming the charge trap layer having the silicon nano dots and the silicon oxide layer covering the silicon nano dots by partially oxidizing the amorphous silicon film may include annealing the amorphous silicon film at a temperature of about 800° C. to about 900° C. for about 2 minutes to about 3 minutes under a gas atmosphere of about 90% $N_2$ and about 10% $O_2$.

Doping the charge trap layer with aluminum (Al) may include forming the blocking film by depositing alumina ($Al_2O_3$) on the charge trap layer, and annealing the substrate at a temperature of about 1000° C. to about 1200° C. for about 1 minute to about 5 minutes. Doping the charge trap layer with aluminum (Al) may include injecting aluminum (Al) ions into the charge trap layer. Doping the charge trap layer with aluminum (Al) may include depositing aluminum (Al) on the charge trap layer, and doping the aluminum (Al) to the charge trap layer by annealing the substrate.

Forming the amorphous silicon film on the tunneling film may include depositing aluminum (Al) together with amorphous silicon, and doping the charge trap layer with aluminum (Al) may include annealing the substrate at a temperature of about 1000° C. to about 1200° C. for about 1 minute to about 5 minutes.

According to example embodiments, a method of fabricating a non-volatile memory device may include providing a substrate including a source and a drain on separate regions of the substrate, forming a tunneling film on the substrate contacting the source and the drain, forming the charge trap layer structure according to example embodiments on the tunneling film, forming a blocking film on the charge trap layer, and forming a gate electrode on the blocking film. Forming the blocking film may include forming the blocking film to a thickness of about 20 nm to about 30 nm. The source and drain may be doped with an n-type impurity. Forming the tunneling film may include forming a silicon oxide film.

BRIEF DESCRIPTION OF THE DRAWINGS

Example embodiments will be more clearly understood from the following detailed description taken in conjunction with the accompanying drawings. FIGS. 1-10 represent non-limiting, example embodiments as described herein.

FIG. 1 is a cross-sectional view of a non-volatile memory device according to example embodiments;

FIGS. 2-6 are cross-sectional views illustrating a method of manufacturing a non-volatile memory device according to example embodiments;

FIG. 7 is a transmission electron microscope (TEM) image of a portion of the non-volatile memory device of FIG. 1, according to example embodiments;

FIG. 9 is a graph showing retention characteristics of the non-volatile memory device of FIG. 1, according to example embodiments; and FIG. 10 is a graph showing retention characteristics of a non-volatile memory device that uses an $HfO_2$ film as a blocking film and a partially oxidized amorphous silicon layer as a charge trap layer according to example embodiments.

Figure 1:
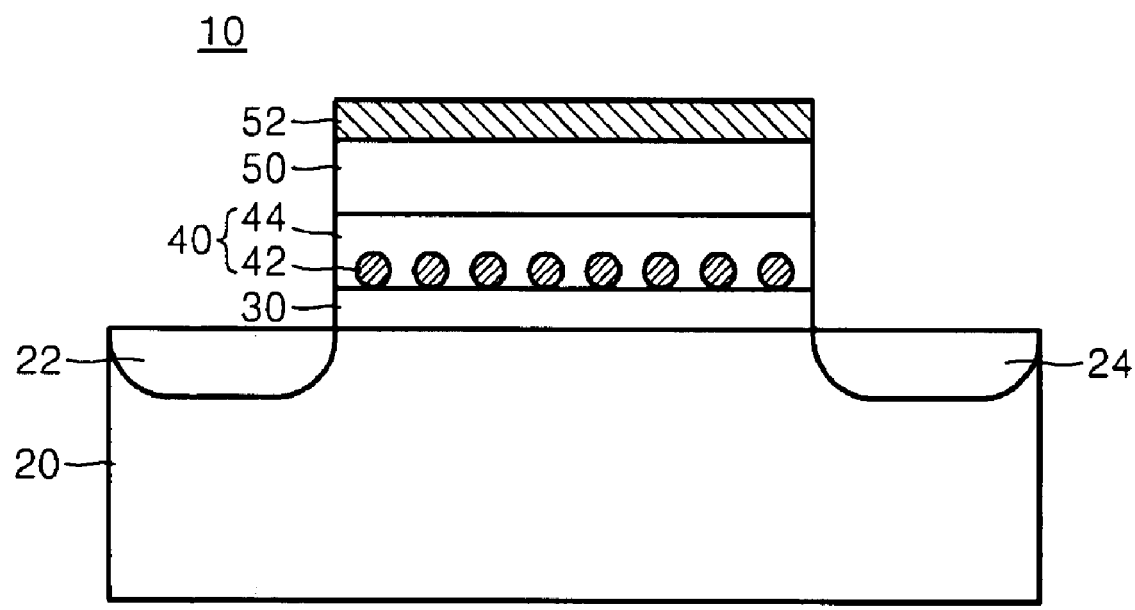

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

A non-volatile memory device having an Al-doped charge trap layer and a method of fabricating the non-volatile memory device according to example embodiments will now be described more fully with reference to the accompanying drawings in which example embodiments are shown. In the drawings, the thicknesses of layers and regions are exaggerated for clarity. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are, schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a non-volatile memory device 10 according to example embodiments. Referring to FIG. 1, a source region 22 and a drain region 24, which are doped with an n-type impurity, may be formed on a surface of a substrate 20. The substrate 20 may be a p-type silicon substrate. A tunneling film 30, which contacts the source region 22 and the drain region 24, may be formed between the source region 22 and the drain region 24 on the substrate 20. A charge trap layer 40, a blocking film 50, and a gate electrode 52 may be sequentially formed on the tunneling film 30. The tunneling film 30 may be a silicon oxide film.

The charge trap layer 40 may include a plurality of silicon nano dots 42 and a silicon oxide layer 44 that includes the plurality of silicon nano dots 42, and aluminum (Al) may be doped on the silicon nano dots 42 and the silicon oxide layer 44. The charge trap layer 40 may be a partially oxidized amorphous silicon layer having a thickness of about 2 nm to about 10 nm, and may be doped with aluminum (Al) at a concentration of about 0.1 atom % to about 10 atom % such that the aluminum (Al) may increase the retention characteristics of the charge trap layer 40. If aluminum (Al) is doped with a concentration of about 10 atom % or more, the charge trap layer 40 may have characteristics of a conductive layer, and accordingly, the retention characteristics for trapping charges may be reduced. If aluminum (Al) is doped with a concentration of about 0.1 atom % or less, the aluminum (Al) may not increase the retention characteristics of the charge trap layer 40.

The blocking film 50 may be made of a compound selected from the group consisting of $Si_3N_4$, $HfO_2$, $Ta_2O_5$, $ZrO_2$, and $Al_2O_3$, e.g., $Al_2O_3$, to a thickness of about 20 nm to about 30 nm. The alumina ($Al_2O_3$) may be used as an aluminum (Al) doping source material. The blocking film 50 may prevent or reduce carriers from migrating to the gate electrode 52 in a process of trapping the carriers.

Figure 2:
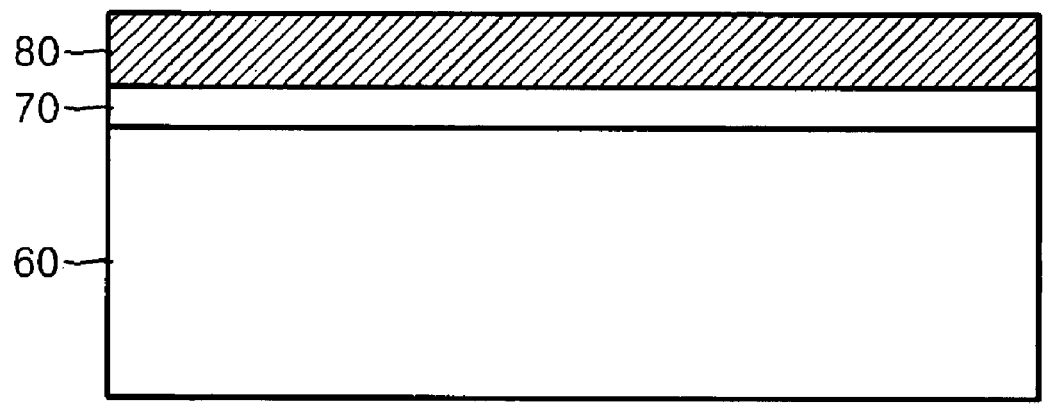

FIGS. 2-6 are cross-sectional views illustrating a method of manufacturing a non-volatile memory device according to example embodiments. Referring to FIG. 2, a tunneling film 70 and an amorphous silicon film 80 may be sequentially formed on a substrate 60. The substrate 60 may be a p-type silicon substrate. The tunneling film 70 may be a silicon oxide $SiO_2$ film formed by oxidizing a surface of the substrate 60. The amorphous silicon film 80 may be formed to a thickness of about 1 nm to about 5 nm, for example, about 2 nm to about 3 nm. The amorphous silicon film 80 may be formed using an atomic layer deposition (ALD) method and/or an ion beam deposition method.

Figure 3:
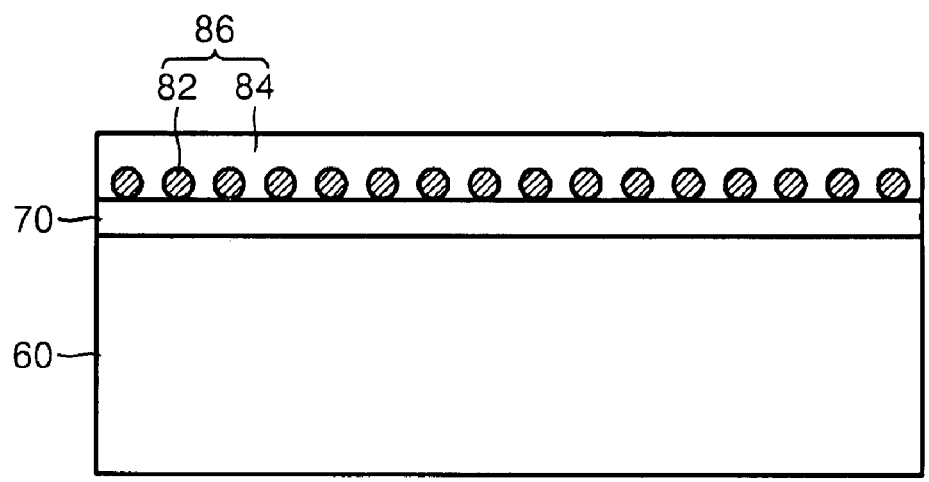

After the amorphous silicon film 80 is formed, the amorphous silicon film 80 may be incompletely oxidized at a relatively low temperature. For example, the amorphous silicon film 80 may be annealed at a temperature of about 800° C. to about 900° C. for about 2 minutes to about 3 minutes under a gas atmosphere of about 90% $N_2$ and about 10% $O_2$. As shown in FIG. 3, a portion of the amorphous silicon film 80 may be partially oxidized to form a silicon oxide layer 84, and the other portion of the amorphous silicon film 80 may remain as a plurality of silicon nano dots 82. For example, the amorphous silicon film 80 in FIG. 2 may become a partially oxidized amorphous silicon layer 86. The thickness of the partially oxidized amorphous silicon layer 86 may vary according to the thickness of the amorphous silicon film 80, however, the thickness of the partially oxidized amorphous silicon layer 86 may be about 2 nm to about 10 nm.

Figure 4:
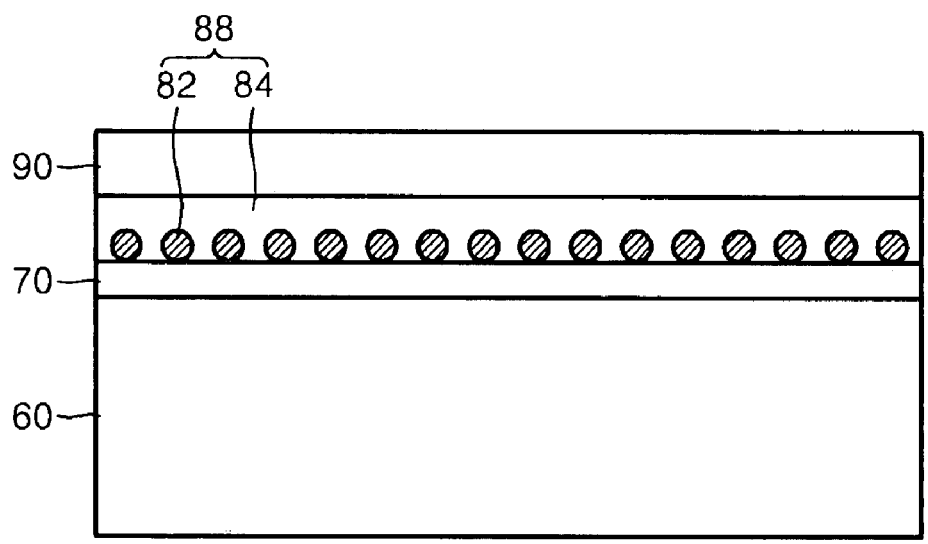

Referring to FIG. 4, in order to dope aluminum (Al) on the silicon oxide layer 84, an alumina layer 90, which functions as a blocking film, having a thickness of about 20 nm to about 30 nm, may be deposited on the silicon oxide layer 84. When the substrate 60 is annealed at an increased temperature of about 1000° C. to about 1200° C. for about 1 minute to about 5 minutes, some aluminum (Al) may migrate to the silicon oxide layer 84 from the alumina layer 90.

The partially oxidized amorphous silicon layer 86 may be partially doped with aluminum (Al), and thus, a charge trap layer 88 may include the silicon oxide layer 84, the silicon nano dots 82 formed in the silicon oxide layer 84, and aluminum (Al) doped on the silicon oxide layer 84 and the silicon nano dots 82. The aluminum (Al) doping on the silicon oxide layer 84 and the silicon nano dots 82 may be at a concentration of about 0.1 atom % to about 10 atom %. The alumina layer 90 may be formed of an aluminum rich alumina so that the amount of aluminum (Al) doping on the silicon oxide layer 84 and the silicon nano dots 82 may be more easily controlled.

Figure 5:
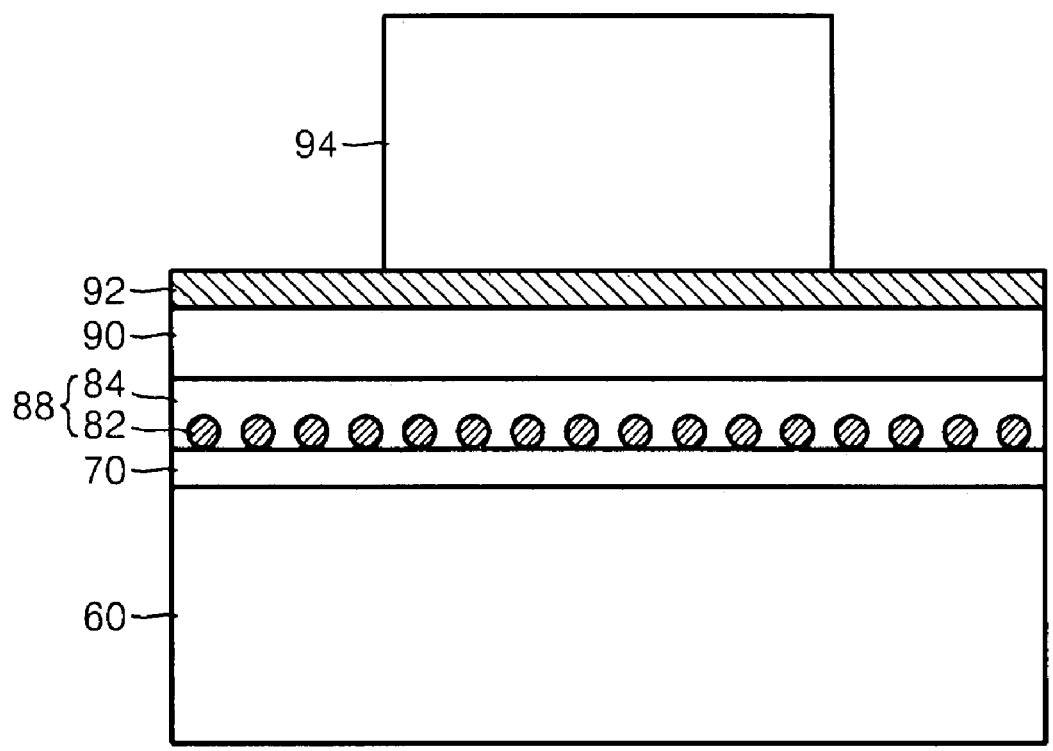
Figure 6:
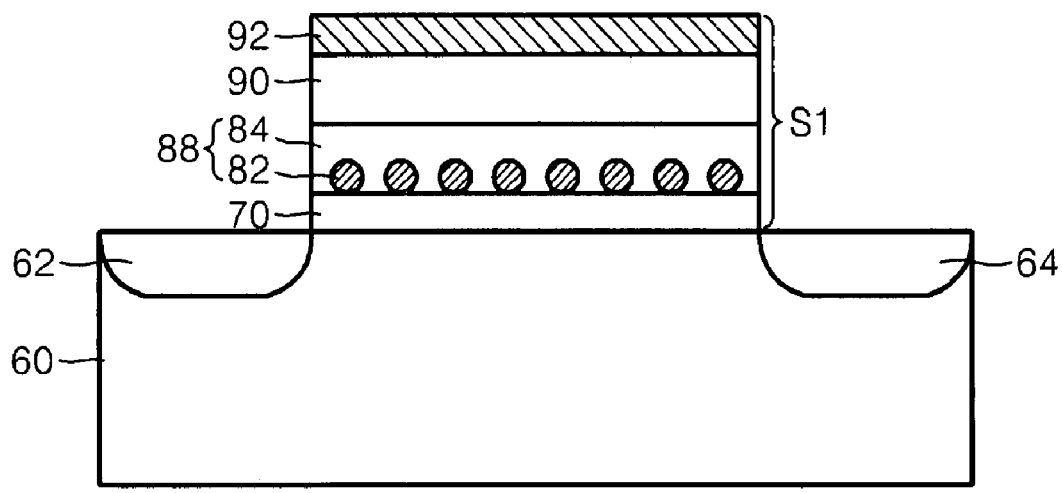

Referring to FIG. 5, an electrode layer 92 may be formed on the blocking film 90, and a photosensitive pattern 94, which defines a region for forming a gate stack S1 (refer to FIG. 6), may be formed on the electrode layer 92. The electrode layer 92 may be, for example, a metal layer and/or a metal silicide layer. The tunneling film 70, the charge trap layer 88, the blocking film 90, and the electrode layer 92 stacked on the substrate 60 may be sequentially etched using the photosensitive pattern 94 as an etching mask. Afterwards, the photosensitive pattern 94 may be removed. As depicted in FIG. 6, the gate stack S1, which includes the tunneling film 70, the charge trap layer 88, the blocking film 90, and the electrode layer 92, may be formed on a region of the substrate 60 corresponding to the photosensitive pattern 94.

A source region 62 and a drain region 64 may be formed by injecting a conductive impurity in the substrate 60 using the gate stack S1 as a mask. A non-volatile memory device having a charge trap layer 88 in the gate stack S1 may be fabricated. The conductive impurity may be an n-type impurity, which is opposite to the impurity injected into the substrate 60.

Figure 7:
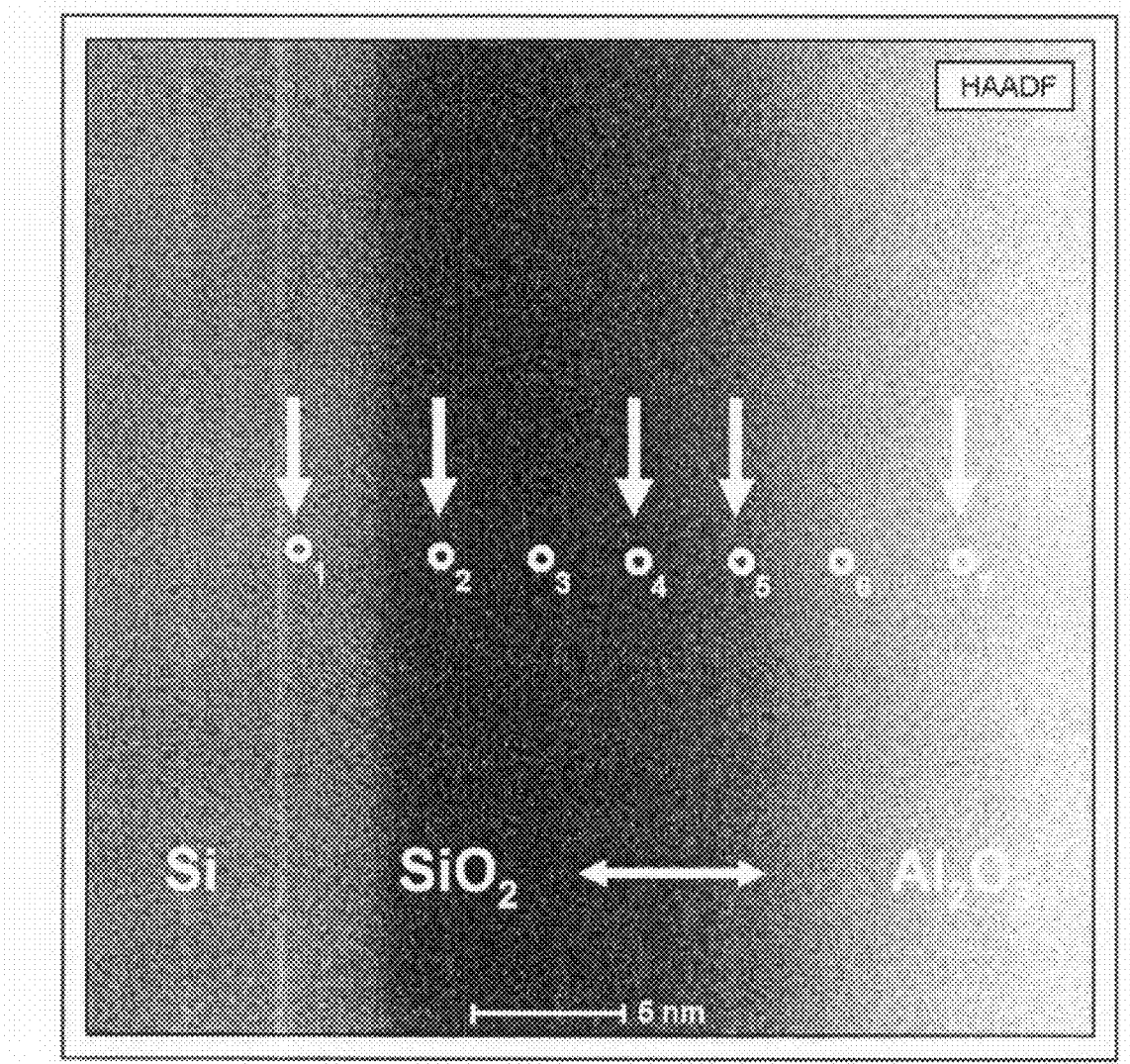
Figure 8A:
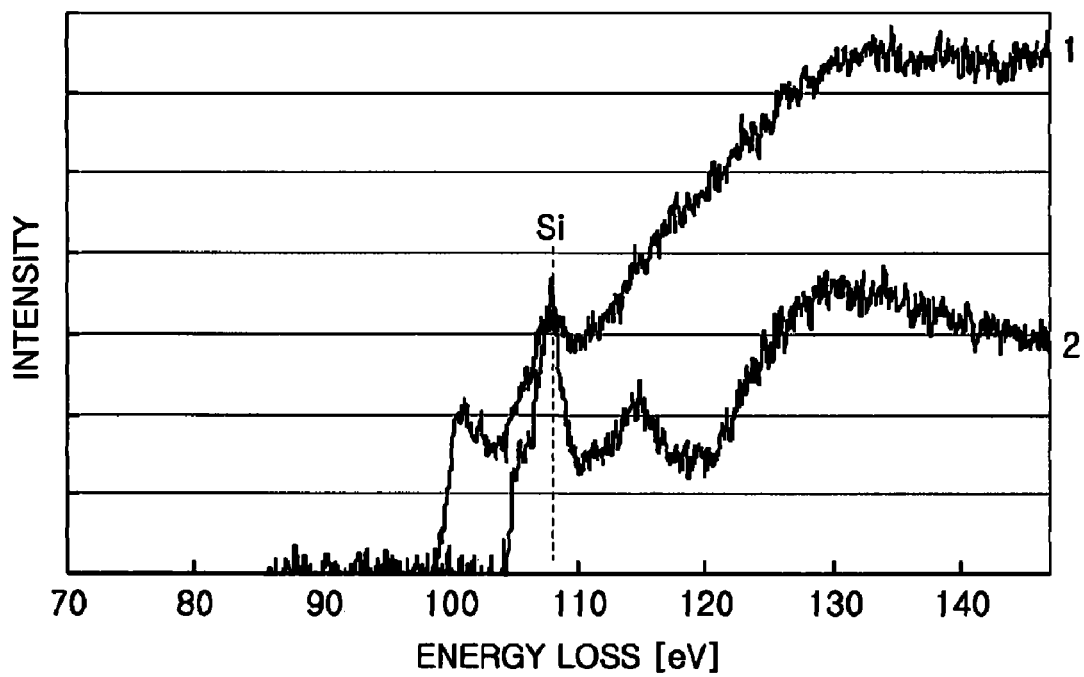
FIGS. 8A and 8B are graphs showing an analysis of elements in positions in the TEM image of FIG. 7, according to example embodiments.
Figure 8B:
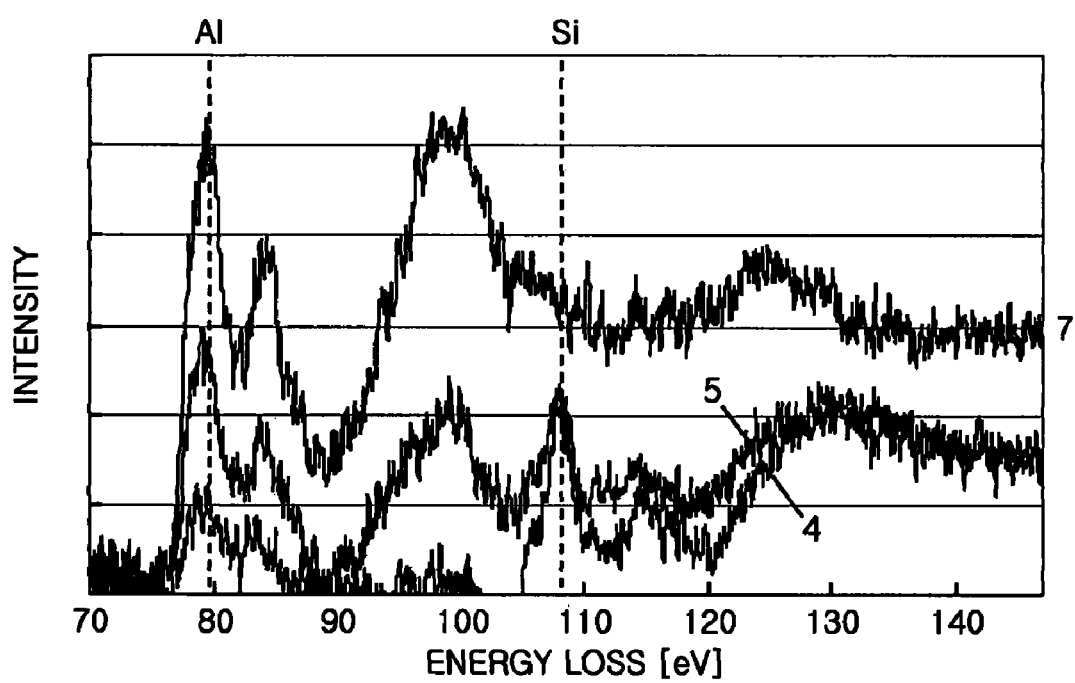

FIG. 7 is a transmission electron microscope (TEM) image of a portion of the non-volatile memory device 10 of FIG. 1, which includes the partially oxidized amorphous silicon layer 86 doped with aluminum (Al), according to example embodiments. FIGS. 8A and 8B are graphs showing an analysis of elements in positions in the TEM image of FIG. 7, according to example embodiments.

Referring to FIGS. 7, 8A and 8B, in lines 1 and 2, silicon (Si) peaks may be detected, which denote that line 1 is the silicon substrate and line 2 is a $SiO_2$ region. In line 7, an aluminum (Al) peak may be detected, which denotes that the line 7 is an alumina region. In lines 4 and 5, an aluminum (Al) peak and a silicon (Si) peak may be detected, which denotes that lines 4 and 5 are silicon oxide regions and also aluminum (Al) doped regions. Line 5 has a higher aluminum (Al) peak than that of line 4, which denotes that line 5 is doped with an amount of aluminum (Al) larger than line 4.

Figure 9:
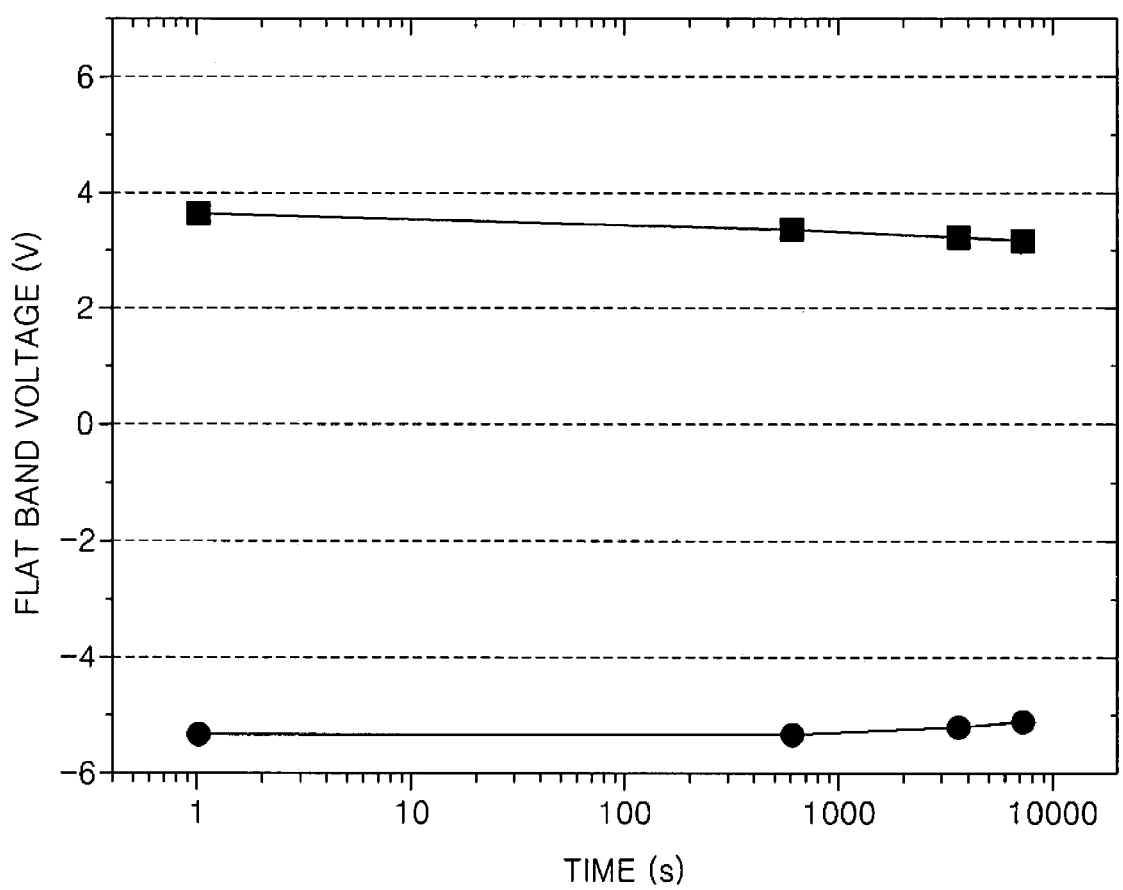
Figure 10:
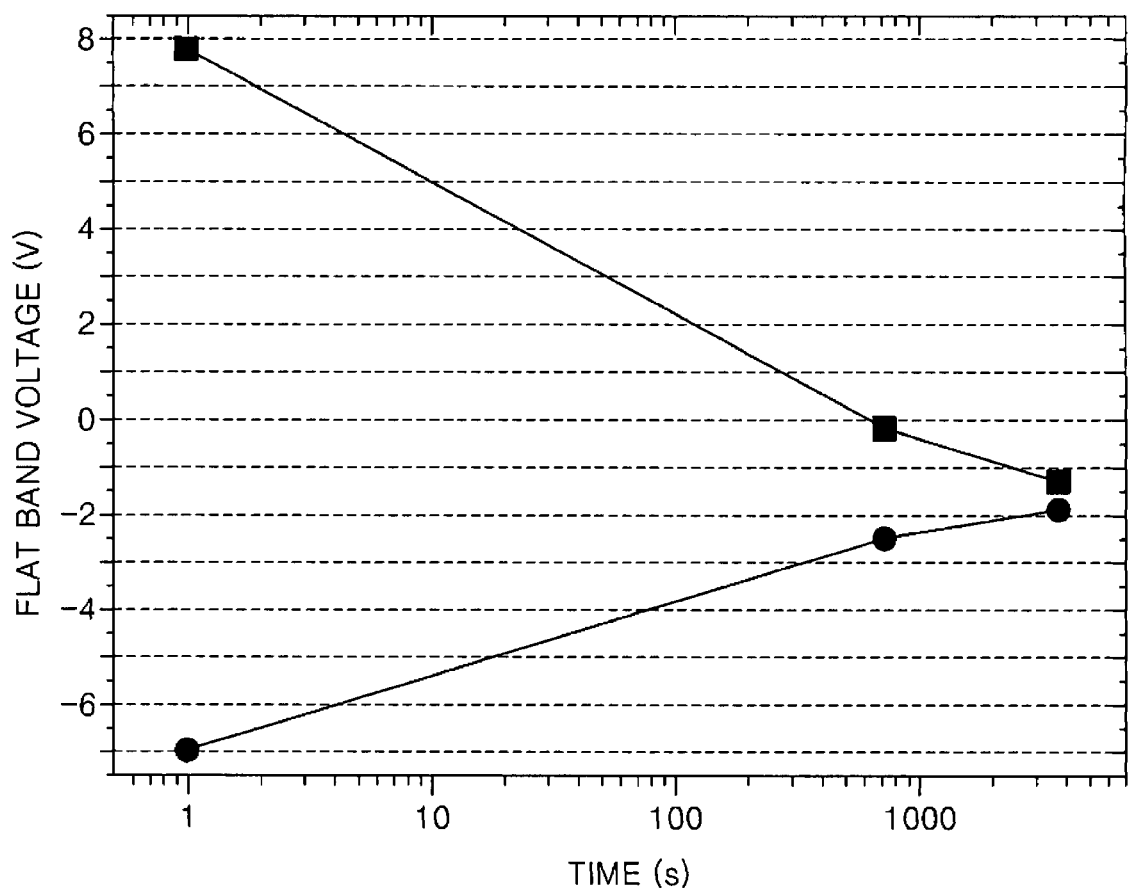

FIG. 9 is a graph illustrating retention characteristics of the non-volatile memory device according to example embodiments, and FIG. 10 is a graph illustrating retention characteristics of a non-volatile memory device that uses an $HfO_2$ film as a blocking film and uses a partially oxidized amorphous silicon layer as a charge trap layer. In order to measure the retention characteristics of the non-volatile memory device, flat band voltages, according to time lapse, may be measured after electrons and holes are trapped in a charge trap layer by applying about +20V and about −20V to a gate electrode.

In the non-volatile memory device according to example embodiments, the variation of the flat band voltage, according to time lapse, may be lower when compared with the non-volatile memory device of FIG. 10, for example, the retention characteristics may be improved. As described above, a non-volatile memory device having an aluminum (Al) doped charge trap layer according to example embodiments may have improved retention characteristics, thereby being applicable to various kinds of non-volatile memory devices. A method of fabricating a non-volatile memory device according to example embodiments may prevent or reduce a tunneling film from being damaged by silicon (Si) diffusion because a silicon rich oxide film may be annealed in an incomplete oxidation condition.

While example embodiments have been particularly shown and described with reference to example embodiments thereof, it will be understood by those of ordinary skill in the art that various changes in form and details may be made therein without departing from the spirit and scope of the following claims.

What is claimed is:

1. A method of forming a charge trap layer structure comprising:
    forming an amorphous silicon film on a tunneling film;
    forming a charge trap layer having a plurality of silicon nano dots and a silicon oxide layer covering the silicon nano dots by partially oxidizing the amorphous silicon film; and doping the charge trap layer with aluminum (Al) at a concentration of about 0.1 to about 10 atom %.

2. The method of claim 1, wherein forming the amorphous silicon film includes depositing the amorphous silicon film to a thickness of about 1 nm to about 5 nm.

3. The method of claim 1, wherein forming the charge trap layer includes annealing the amorphous silicon film at a temperature of about 800° C. to about 900° C. for about 2 minutes to about 3 minutes under a gas atmosphere of about 90% N2 and about 10% O2.

4. The method of claim 1, wherein doping the charge trap layer with aluminum (Al) includes:
   forming a blocking film by depositing alumina Al2O3 on the charge trap layer; and
   annealing the substrate at a temperature of about 1000° C. to about 1200° C. for about 1 minute to about 5 minutes.

5. The method of claim 1, wherein doping the charge trap layer with aluminum (Al) includes injecting aluminum (Al) ions into the charge trap layer.

6. The method of claim 1, wherein doping the charge trap layer with aluminum (Al) includes:
   depositing aluminum (Al) on the charge trap layer; and
   doping the aluminum (Al) to the charge trap layer by annealing the substrate.

7. The method of claim 1, wherein forming the amorphous silicon film includes depositing aluminum (Al) together with amorphous silicon, and doping the charge trap layer with aluminum (Al) includes annealing the substrate at a temperature of about 1000° C. to about 1200° C. for about 1 minute to about 5 minutes.

8. A method of fabricating a non-volatile memory device comprising:
   providing a substrate including a source and a drain on separate regions of the substrate;
   forming a tunneling film on the substrate contacting the source and the drain;
   forming a charge trap layer structure on the tunneling film by forming an amorphous silicon film on the tunneling film, forming a plurality of silicon nano dots and a silicon oxide layer covering the silicon nano dots by partially oxidizing the amorphous silicon film, and doping the charge trap layer with aluminum (Al) at a concentration of about 0.1 to about 10 atom %;
   forming a blocking film on the charge trap layer; and
   forming a gate electrode on the blocking film.

9. The method of claim 8, wherein forming the blocking film includes forming the blocking film to a thickness of about 20 nm to about 30 nm.

10. The method of claim 8, wherein the source and drain are doped with an n-type impurity.

11. The method of claim 8, wherein forming the tunneling film includes forming a silicon oxide film.

* * * * *